United States Patent [19]

Lu et al.

[11] Patent Number: 4,688,063
[45] Date of Patent: Aug. 18, 1987

[54] DYNAMIC RAM CELL WITH MOS TRENCH CAPACITOR IN CMOS

[75] Inventors: Nicky C. Lu; Tak H. Ning, both of Yorktown Heights; Lewis M. Terman, South Salem, all of N.Y.

[73] Assignee: International Business Machines Corporation, Armonk, N.Y.

[21] Appl. No.: 920,916

[22] Filed: Oct. 21, 1986

Related U.S. Application Data

[63] Continuation of Ser. No. 626,512, Jun. 29, 1984, abandoned.

[51] Int. Cl.$^4$ .............................................. H01L 29/78
[52] U.S. Cl. ................................ 357/23.6; 357/23.11; 357/51; 357/55; 357/59; 365/149
[58] Field of Search .................... 357/23.6, 23.11, 51, 357/55, 59; 365/149

[56] References Cited

U.S. PATENT DOCUMENTS

| | | | |
|---|---|---|---|
| 4,260,436 | 4/1981 | Taylor | 357/51 |
| 4,296,429 | 10/1981 | Schroeder | 357/55 |
| 4,327,476 | 5/1982 | Iwai et al. | 29/571 |
| 4,329,704 | 5/1982 | Sakurai et al. | 365/149 |
| 4,353,086 | 10/1982 | Jaccodine et al. | 357/51 |
| 4,397,075 | 8/1983 | Fatula, Jr. et al. | 29/571 |
| 4,432,006 | 2/1984 | Takei | 357/23.6 |
| 4,547,792 | 10/1985 | Solar | 357/55 |

FOREIGN PATENT DOCUMENTS

| | | | |
|---|---|---|---|
| 18764 | 11/1980 | European Pat. Off. | 365/149 |
| 21776 | 1/1981 | European Pat. Off. | 365/149 |
| 108390 | 5/1984 | European Pat. Off. | |
| 53-76686 | 7/1978 | Japan | 357/51 |
| 55-39688 | 3/1980 | Japan | 357/23.6 |

OTHER PUBLICATIONS

"Novel High Density, Stacked Capacitor MOS RAM" by M. Koyanagi et al. Proceedings of the 10th Conference on Solid State Devices, Tokyo 1978; Japanese Journal of Applied Physics, Supplement 18-1, pp. 35-42.

"A Corrugated Capacitor (CCC) for Megabit Dynamic MOS Memories" IEEE Electron Device Letters, vol. EDL-4, No. 4 Apr. 1983, pp. 90-91 by H. Sunami et al.

"A Submicron CMOS Megabit Level Dynamic RAM Technology Using Doped Face Trench Capacitor Cell" by K. Minegishi et al., IEDM 83, Dec. 1983, pp. 319-322.

"Very Dense One-Device Memory Cell" IBM Technical Disclosure Bulletin, vol. 25, No. 2 Jul. 1982, pp. 593-596 by C. J. Jambotkar.

Primary Examiner—Joseph E. Clawson, Jr.
Attorney, Agent, or Firm—Thomas J. Kilgannon

[57] ABSTRACT

This invention relates generally to Dynamic Random Access Memory (DRAM) cells and more particularly relates to a DRAM cell wherein the storage capacitor of the cell is disposed in a trench formed in a semiconductor substrate. Still more particularly, it relates to a DRAM cell wherein at least a portion of the substrate is heavily doped and forms the counterelectrode of the storage capacitor while a heavily doped polycrystalline plug disposed in the trench capacitor forms the other electrode of the storage capacitor. The DRAM cell includes a field effect access transistor disposed in a well which is opposite in conductivity type to that of the substrate. The well itself is formed in a lightly doped portion of the substrate and may be n or p-type conductivity with the other portions of the cell having conductivity types appropriate for devices fabricated in the CMOS environment. The trench capacitor extends from the surface of the well through the well and lightly doped substrate portion into the heavily doped portion of the substrate. The electrode disposed in the trench is directly connected to the source/drain of the access transistor.

46 Claims, 4 Drawing Figures

DYNAMIC RAM CELL WITH MOS TRENCH CAPACITOR IN CMOS

This application is a continuation of application Ser. No. 06/626,512 filed June 29, 1984, now abandoned.

TECHNICAL FIELD

This invention relates generally to Dynamic Random Access Memory (DRAM) cells and more particularly relates to a DRAM cell wherein the storage capacitor of the cell is disposed in a trench formed in a semiconductor substrate. Still more particularly, it relates to a DRAM cell wherein at least a portion of the substrate is heavily doped and forms the counterelectrode of the storage capacitor while a heavily doped polycrystalline plug disposed in the trench capacitor forms the other electrode of the storage capacitor. The DRAM cell includes a field effect access transistor disposed in a well which is opposite in conductivity type to that of the substrate. The well itself is formed in a lightly doped portion of the substrate and may be n or p-type conductivity with the other portions of the cell having conductivity types appropriate for devices fabricated in the CMOS environment. The trench capacitor extends from the surface of the well through the well and lightly doped substrate portion into the heavily doped portion of the substrate. The electrode disposed in the trench is directly connected to the source/drain of the access transistor.

BACKGROUND OF THE INVENTION

The recent literature has emphasized "one-device" memory cell arrangements where higher and higher degrees of integration are being sought. This is achieved in most cases by juxtaposing access transistors and storage capacitors to achieve cell area reduction while at the same time increasing the storage capacitance. In the prior art, capacitance is increased by decreasing oxide thickness, increasing the surface capacitor area or forming trench capacitors in semiconductor substrates.

In a co-pending application, assigned to the same assignee as the present application, Ser. No. 620,667, filed June 14, 1984, a DRAM cell is shown wherein a trench capacitor extends into a heavily doped substrate which acts as the counterelectrode of the capacitor. In addition, an FET access transistor is disposed adjacent the trench capacitor and has its source/drain directly connected to the electrode of the trench capacitor disposed in the trench. In the embodiment shown, the access transistor is electrically isolated from other similar cells and from the highly doped substrate by insulation. The application doesn't address the fabrication of such DRAM cells in the CMOS environment wherein the access transistor of the cell is formed within a well disposed in a semiconductor region of opposite conductivity type. To the extent that the structure of the present application incorporates such a well and further incorporates a trench capacitor which penetrates or extends through the well to a heavily doped portion of the substrate, the present application distinguishes over the structure of the above mentioned co-pending application.

An article entitled "Novel High Density, Stacked Capacitor MOS RAM" by M. Koyanagi et al, Proceedings of the 10th Conference on Solid State Devices, Tokyo, 1978; Japanese Journal of Applied Physics, Supplement 18-1, pp. 35–42 describes a Dynamic Random Access Memory (DRAM) cell using a capacitor stacked on top of an associated access transistor. The structure is of interest because the source of the access transistor is directly connected to one electrode of the capacitor. There is, however, no mention of a trench capacitor or any indication that a trench capacitor may be used in conjunction with an access transistor which is disposed in an n or p-well.

An article entitled "A Corrugated Capacitor Cell (CCC) for Megabit Dynamic MOS Memories" by H. Sunami et al, IEEE Electron Device Letters, Vol. ED-6-4, No. 4, April 1983, pp. 90–91, shows a one-device memory cell which is characterized by an etched-moat storage capacitor which extends into the substrate. Structurally, the storage capacitor is disposed alongside an access transistor. The moat is insulated and filled with polysilicon to form one plate of the capacitor. Because a depeletion region is formed in the semiconductor substrate around the moat, when a positive potential is applied to the polysilicon capacitor electrode, a minimum spacing between moats is required to prevent punch-through. This fact militates against denser packing of devices. Also, in order to form an inversion region in the substrate which acts as a storage electrode, the substrate must be $p^-$-conductivity type, suggesting that the authors contemplated neither the use of a substrate as a common counterelectrode nor the penetration of a well by a trench into a highly doped region to obtain the bulk of their capacitance. In the structure of the present application, at least a portion of the substrate must be highly doped to provide a counterelectrode for all the DRAM cells formed on a chip. No short circuiting of the capacitors occurs because the storage electrode is disposed in the trench and insulated from the counterelectrode. In addition, from a structural point of view, there is no direct connection in the reference between a source/drain diffusion and the polycrystalline material disposed within the moat and no access transistor disposed in a well.

An article entitled "A Submicron CMOS Megabit Level Dynamic RAM Technology Using Doped Face Trench Capacitor Cell" by K. Minegishi et al, IEDM 83, December 1983, pp. 319–322 discusses RAM cells in the CMOS environment and shows a trench the wall of which is heavily doped to form an extended source/-drain region for an associated access transistor. A polycrystalline electrode is disposed in insulated spaced relationship with the substrate within the trench which acts as the counterelectrode of the capacitor. In this article, the substrate doesn't act as a counterelectrode inasmuch as a highly doped substrate would degrade the performance of associated transistors. In any event, the capacitor doesn't penetrate a well region and there is no direct connection between the source of the access device and the electrode in the capacitor trench.

U.S. Pat. No. 4,397,075 filed July 3, 1980 shows a one-device memory cell where enhanced capacitance is obtained by extending the drain diffusion into a well etched in the semiconductor substrate. There is no separate capacitor element and the capacitance enhancement is a direct result of increasing the drain p-n junction area.

U.S. Pat. No. 4,327,476 filed Nov. 28, 1980 shows a one-device memory cell which incorporates a capacitor electrode disposed in a groove or trench. The electrode is formed alongside a source/drain region and in insulated spaced relationship with the substrate. There is no interconnection between the capacitor electrode in the trench and the source/drain region. The reference doesn't show the use of a well or a trench which penetrates into a highly doped substrate portion.

An article in the IBM Technical Disclosure Bulletin entitled "Very Dense One-Device Memory Cell" by C. G. Jambotkar, Vol. 25, No. 7, July 1982, p. 593, shows a one-device memory cell wherein the drain diffusion is formed around the periphery of a trench. The inside of the trench is covered with insulation and the remaining void may be filled with polyimide, polysilicon or $SiO_2$. While a trench is formed for the cell shown, no separate capacitor is formed therein. The structure shown does no more than lengthen the drain diffusion to thereby increase the junction capacitance.

From all the foregoing, it should be clear that none of the above cited references provides a memory cell wherein both the access transistor and its associated trench capacitor are formed in a well disposed in an opposite conductivity type substrate. As a result, prior art structures incorporating a well are limited as to the amount of capacitance which can be obtained because it was not perceived that the trench could penetrate through the well and achieve most of the capacitive effect in the heavily doped counterelectrode portion of the substrate. Thus, none of the references cited shows the combination of the access transistor and trench capacitor disposed in a well where the trench capacitor extends from the well or penetrates through the well to a highly doped substrate and wherein the source of the access transistor is directly connected to the electrode disposed inside the trench.

It is, therefore, a principal object of the presnet invention to provide a "one-device" DRAM cell wherein both an access transistor and its associated trench capacitor are formed in a well in a semiconductor substrate.

Another object is to provide a DRAM cell wherein the depth of the trench capacitor is greater than the depth of a well in which as associated transistor is formed.

Another object is to provide a DRAM cell wherein a trench capacitor extends from a well into a highly doped substrate wherein the greatest portion of the capacitance of the cell is obtained.

Still another object is to provide a DRAM cell wherein the capacitance obtainable is greater than that obtained using prior art approaches.

Yet another object is to provide a DRAM cell which is not subject to punch-through between adjacent capacitor trenches and is less subject to alpha particle induced soft errors inherent in memory cells which use relatively high resistivity substrates.

Yet another object is to provide a DRAM cell which is less susceptible to soft errors due to minority carrier injection from peripheral circuits.

BRIEF SUMMARY OF THE INVENTION

The present invention relates to a Dynamic Random Access (DRAM) cell which utilizes an FET access transistor and a storage capacitor both of which are formed in a well in a semiconductor substrate. The well is of opposite conductivity type to that of the substrate and includes the source, drain and channel regions of he access transistor. Also included is a trench which extends through the well to a heavily doped substrate region which acts as the counterelectrode of the storage capacitor. The electrode of the storage capacitor is disposed in insulated, spaced relationship with the substrate and may be made of heavily doped polycrystalline silicon. The electrode is connected by means of a bridge region to the source of the access transistor. A polysilicon gate disposed over the channel region completes the basic structure of the DRAM cell. The well formed in the substrate may be either p or n- conductivity type. Where the well is of one conductivity type, the substrate is of heavily doped opposite conductivity type and includes a more lightly doped region of like conductivity in which the well is disposed. The lightly doped region provides a transition from the heavily doped portion of the substrate of one conductivity type to the opposite conductivity type of the well to reduce the likelihood of breakdown at the junction between the regions. The heavily doped portion of the substrate, in addition to acting as the counterelectrode of the trench capacitor, makes the resulting memory cell less susceptible to soft errors due to alpha particle impingement.

In the cell of the present invention, the well is biased to a fixed potential and the access transistor polysilicon gate forms part of a word line to which a plurality of DRAM cells of an array are connected. Similarly, the source/drain of the FET access transistor is connected to a bit line to which a plurality of drains of other DRAM cells in an array are connected. By applying appropriate word and bit line potentials to the access transistor, binary information may be written into and read from the storage capacitor.

The DRAM cell of the present invention may be implemented using either p-channel or n-channel access transistors. The conductivity type of the source and drain regions governs the conductivity type of the polycrystalline silicon used as the capacitor electrode.

A technique for fabricating the structure of the DRAM cell of the present invention is also disclosed. The process used does not depart greatly from processes used to fabricate Complementary Metal Oxide Semiconductor (CMOS) devices. One significant departure is that, after formation of a well in a lightly doped portion of the substrate, a trench is formed by reactive ion etching which extends from the surface of the well, through the well and into the heavily doped portion of the substrate. Thereafter, the trench is lined with insulating material and filled with polycrystalline material. Then, using a second layer of polycrystalline silicon, a bridge region is formed which interconnects the electrode in the trench with the source region of the access transistor. A portion of the source region is formed when a portion of the bridge region out-diffuses dopant during a subsequent annealing step. The resulting structure has good surface topology and is not subject to minimum spacing requirements of prior art trench capacitors and is less subject to soft error occurrences found in prior art DRAM cells.

These and other objects, features and advantages of the present application will be apparent from the following more particular description of a preferred embodiment.

BRIEF DESCRIPTION OF THE DRAWINGS

FIG. 4 shows a bridge region interconnecting the electrode of the trench capacitor and the source region of the access transistor. A masking nitride layer is also shown which masks the substrate surface during an oxidation step which augments the recessed oxide regions.

DESCRIPTION OF THE PREFERRED EMBODIMENT

In what follows, access transistor 2 will be characterized as having source and drain regions. For purposes of description, the drain region is that region which is connected to the bit line of a memory array. Also, the electrode of the trench capacitor 3 is that electrode on which charge is stored via access transistor 2 while the counterelectrode is that electrode on which charge is induced.

Figure 1:
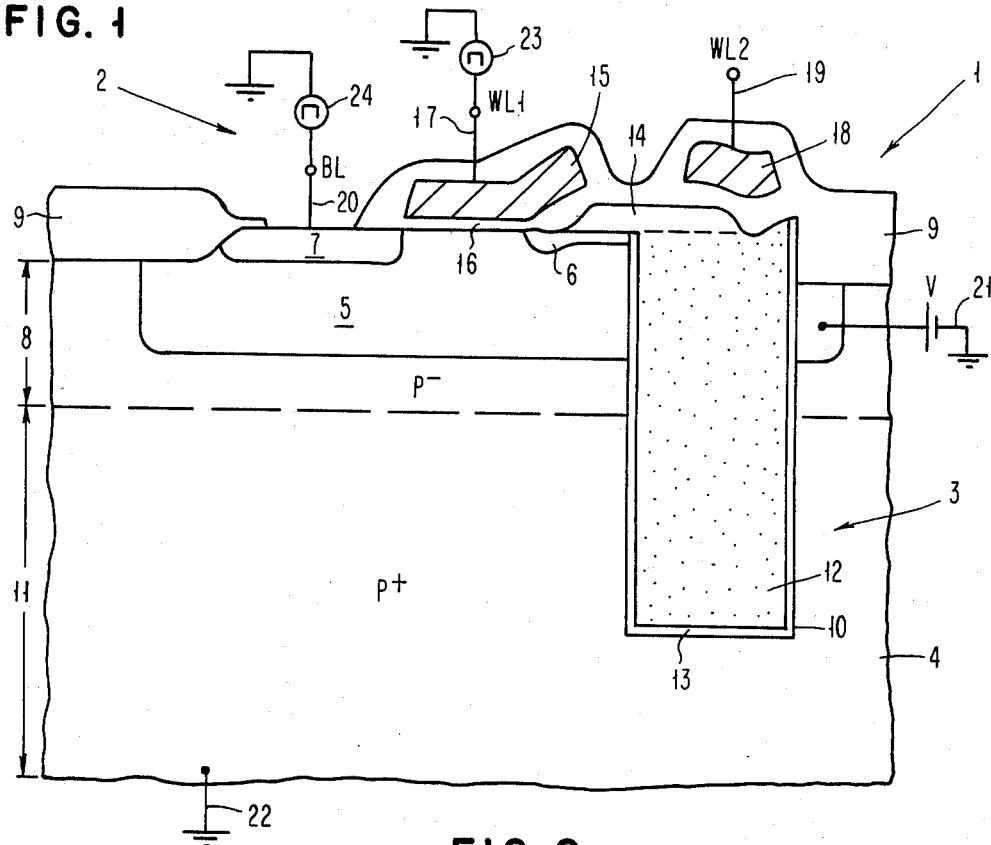
FIG. 1 is a partially schematic, cross-sectional view of a Dynamic Random Access Memory (DRAM) cell which shows an access transistor disposed alongisde a trench capacitor. The source of the access transistor is directly connected to an electrode within the trench. The latter extends through an n-well and a lightly doped p$^-$-region of the substrate into a heavily doped pregion of the substrate. The substrate acts as a counterelectrode of the trench capacitor while the electrode disposed within the trench acts as the other electrode of the trench capacitor. A bias voltage source is shown connected to the n-well and the substrate is connected to ground potential.

Referring to FIG. 1, there is shown a partially schematic, cross-sectional view of a Dynamic Random Access Memory (DRAM) cell 1 which includes a field effect access transistor 2 and a trench capacitor 3 both of which are formed in a semiconductor substrate 4 preferably of silicon. Access transistor 2 is formed in an n-well 5 and includes source region 6 and drain region 7 of heavily doped p+-conductivity type. N-well 5 is disposed in a lightly doped p⁻-conductivity type portion 8 of substrate 4. A recessed oxide (ROX) region 9 isolates memory cell 1 from other similar memory cells formed on substrate 4. In FIG. 1, trench capacitor 3 is formed from a trench 10 which extends from the surface of substrate 4 through n-well 5 and lightly doped substrate portion 8 into a heavily doped p+-conductivity type portion 11 of substrate 4. A plug 12 of heavily doped p+-conductivity type polycrystalline silicon is disposed in trench 10 and insulated from substrate 4 by means of a layer 13 of insulation. Layer 13 may be a single layer of silicon dioxide or preferably may be a composite triple layer made up of layers of silicon dioxide, silicon nitride and silicon dioxide. Source region 6 and plug 12 are electrically and physically interconnected by means of a bridge region 14 of heavily doped p+-conductivity type polycrystalline silicon. Region 14 may be made of any conductive material provided it is compatible with the process being utilized. A gate electrode 15 of heavily doped n+-conductivity polycrystalline silicon is shown disposed over and insulated from the channel region between source region 6 and drain region 7 by a thin gate oxide 16. Gate electrode 15 is connected via interconnection 17 to other gate electrodes of an array of DRAM cells 1 and is otherwise identified in FIG. 1 as WL1.

In FIG. 1, a heavily doped n+-conductivity polycrystalline silicon element 18 is shown disposed over plug 12 and insulated from it by oxide. Element 18 forms a connection to the gate electrodes of adjacent DRAM cells 1 and results in a considerable saving in memory cell area because the area over trench capacitor 3 can be utilized without any degradation in device characteristics. Element 18 is connected via interconnection 19 to other gate electrodes of the array of DRAM cells 1 and is otherwise identified in FIG. 1 as WL2. Drain region 7 acts as the bit line for a plurality of DRAM cells 1 which are all connected to one of the bit lines of an array of DRAM cells 1. Drain region 7 is connected to other device drains via interconnection 20 otherwise identified in FIG. 1 as BL. While not specifically shown in FIG. 1, interconnection 20 is normally formed from metallization such as aluminum.

FIG. 1 shows a voltage source 21, otherwise identified therein as V, connected to n-well 5 to provide a bias to it. Substrate 4 is shown connected to ground via interconnection 22. Also, pulsed voltage sources 23,24 are shown in FIG. 1 connected to interconnections 17,21, respectively. These sources, when activated, write binary information into trench capacitor 3. The activation of source 17 reads binary information from trench capacitor 3. Specific voltages will be discussed below when the operation of DRAM cell 1 is discussed in some detail.

At this point, it should be noted that trench capacitor 3 penetrates through the p-n junction between n-well 5 and the lightly doped, p⁻-conductivity type portion 8 and, as a result, the capacitance obtainable is not limited like it is in prior art arrangements where the capacitance obtainable is limited by the thickness of the epitaxial layer.

Figure 2:
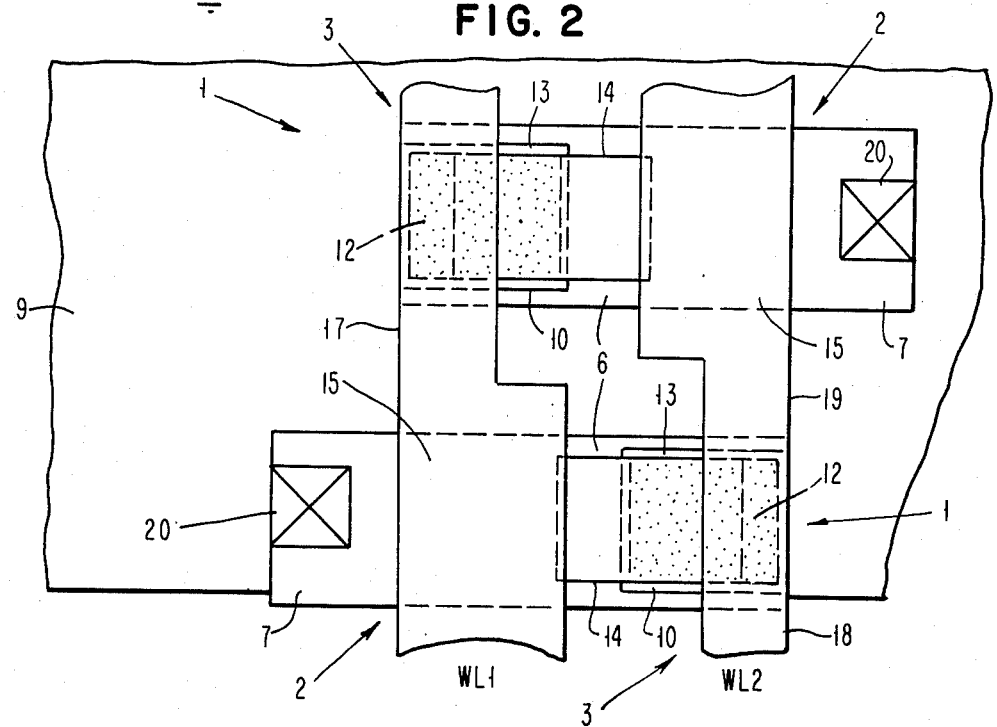
FIG. 2 is a partial plan view of the DRAM cell of FIG. 1 showing the relationship of the access transistor to the trench capacitor. In addition, a second DRAM cell layout is shown to indicate how area savings are obtained by switching the trench capacitor from one side of the cell to the other for each succeeding cell.

Referring now to FIG. 2, there is shown a plan view of DRAM cell 1 shown in FIG. 1. In the layout drawing of FIG. 2, both the relationship of trench capacitor 3 to access transistor 2 and the relationship of DRAM cell 1 to an adjacent similar DRAM cell 1 are shown. To achieve area conservation, trench capacitor 3 is first disposed adjacent the right-hand side of lower DRAM cell 1 in FIG. 2. For the uppermost of the two DRAM cells 1 shown in FIG. 2, trench capacitor 3 is disposed adjacent the left-hand side of cell 1 and in line with the interconnection 17. The area over this trench capacitor 3 is covered with oxide. In this way, WL1 or interconnection 17 is connected to gate electrode 15 of the lowermost DRAM cell 1 and extends over trench capacitor 3 of the uppermost DRAM cell 1 in FIG. 2. In a similar way, WL2 is connected to gate electrode 15 of the uppermost DRAM cell 1 and extends over trench capacitor 3 of the lowermost DRAM cell 1. By repeating the pattern for pairs of DRAM cells 1 as shown in FIG. 1, considerable savings in area can be obtained.

Figure 3:
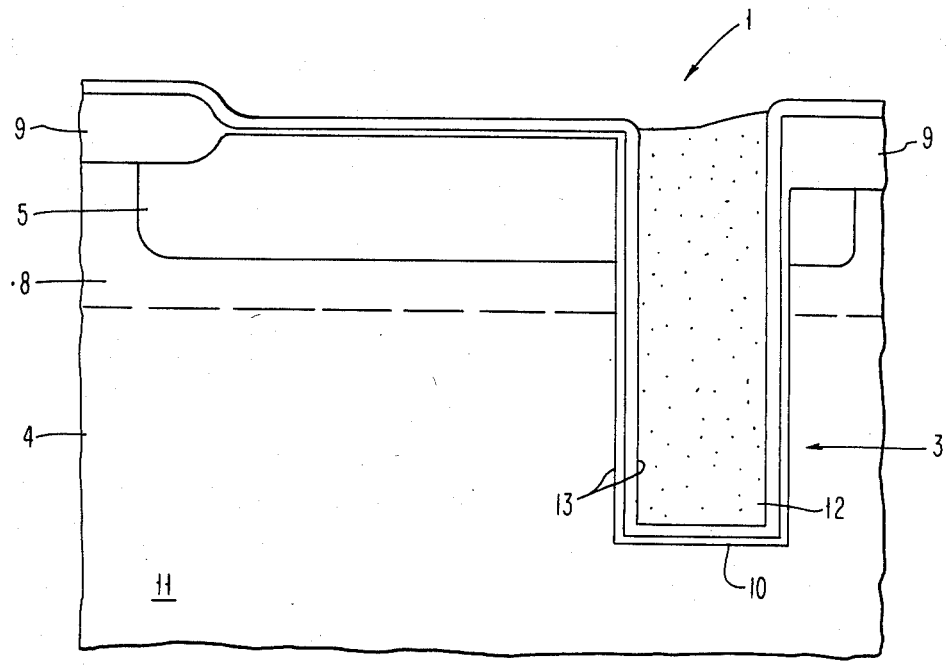
FIG. 3 is a cross-sectional view of the structure of FIG. 1 at an intermediate stage in its fabrication process showing a trench penetrating through a well and a lightly doped portion of a semiconductor substrate into a heavily doped portion of the substrate. The trench itself is shown filled with polycrystalline silicon.

Referring now to FIG. 3, there is shown a cross-sectional view of the structure of FIG. 1 at an intermediate stage in its fabrication process after n-well 5, ROX regions 9 and trench capacitor 3 have been created. The fabrication of DRAM cell 1 is begun by depositing an epitaxial layer of p⁻-conductivity type of silicon from silane doped with boron on p+-conductivity type portion 11 to form portion 8 of silicon substrate 4 in which access transistor 2 and trench capacitor 3 are to be formed. The doping level in portion 8 is $2 \times 10^{15}$ atoms cm$^{-3}$ while that in portion 11 is $1 \times 10^{19}$ atoms cm$^{-3}$.

After depositing substrate portion 8, a layer of oxide is thermally grown on its surface. A layer of photoresist is deposited on the oxide layer and is patterned using well-known techniques to form an opening through which ions will be implanted to form n-well 5. In order to obtain a retrograde doping profile in n-well 5, a deep ion implantation step followed by a shallow ion implantation are carried out. The deep ion implantation step provides a high conductivity region near the bottom of n-well 5 which eliminates noise problems which might arise if n-well 5 remained highly resistive. Either arsenic or phosphorus is ion implanted in a well-known way to a depth which does not penetrate through portion 8 of substrate 4. The latter is then annealed to activate the implanted species. The implanted dopant has a concentration of $10^{17}$ atoms cm$^{-3}$ near the bottom of the implant while it is $2 \times 10^{16}$ atoms cm$^{-3}$ near the surface of n-well 5. After the surface is thermally oxidized, a nitride layer is deposited everywhere. A layer of photoresist is then deposited and patterned in a well-known way to permit the etching of openings in the nitride and oxide layers to expose portions of the surface of substrate 4 where ROX regions 9 are to be formed. Etchants such as $H_3PO_4$ and buffered HF are used to etch the nitride and oxide, respectively. Using a thermal oxidation step, after stripping the photoresist, ROX regions 9 are formed which isolate DRAM cell 1 electrically from other similar cells formed on substrate 4.

As a prelude to the formation of trench 10 in substrate 4, a photoresist layer is deposited and patterned over the nitride layer. Substrate 4 is then subjected to a Reactive Ion Etching (RIE) step whereby the unmasked portion of substrate 4 is removed down to a desired depth. In the process, unmasked portions of nitride, oxide and substrate portions 8, 11 are removed in that order until trench 10 is formed. Then, in a preferred approach, layer 13 is formed on the surface of trench 10 using alternating layers of oxide, nitride and oxide. The first oxide layer is a layer of thermally grown oxide which forms only on the surface of trench 10 since a nitride layer still masks the surface of substrate 4. Subsequently, a layer of nitride is deposited every where by chemical vapor deposition on the surface of the thermally grown oxide, on the nitride layer between ROX regions 9 and on ROX regions 9. Then, substrate 4 is subjected to a thermal oxidation step which forms a thermally grown oxide in any pinholes which might be present in the previously deposited nitride layer. The multilayer approach, in addition to eliminating pinholes in the resulting layer, prevents out-diffusion of dopant from plug 12 which is to be formed from heavily doped p$^+$-polycrystalline silicon because the nitride layer is an effective diffusion barrier.

A layer of heavily doped polycrystalline silicon is then deposited using the chemical vapor deposition of silicon from silane doped with boron to render the resulting layer 12 p$^+$-conductivity type. The layer is deposited in a thickness sufficient to fill trench 10. Substrate 4 is then subjected to an RIE planarization step to remove the polycrystalline layer everywhere down to the top of trench 10. The nitride layer deposited during the formation of trench insulation layer 13 and the nitride layer between the ROX regions 9 act as etch stops during the RIE planarization step using a well-known optical end-point detect technique. At this point, DRAM cell 1 has the structure shown in cross section in FIG. 3.

Figure 4:
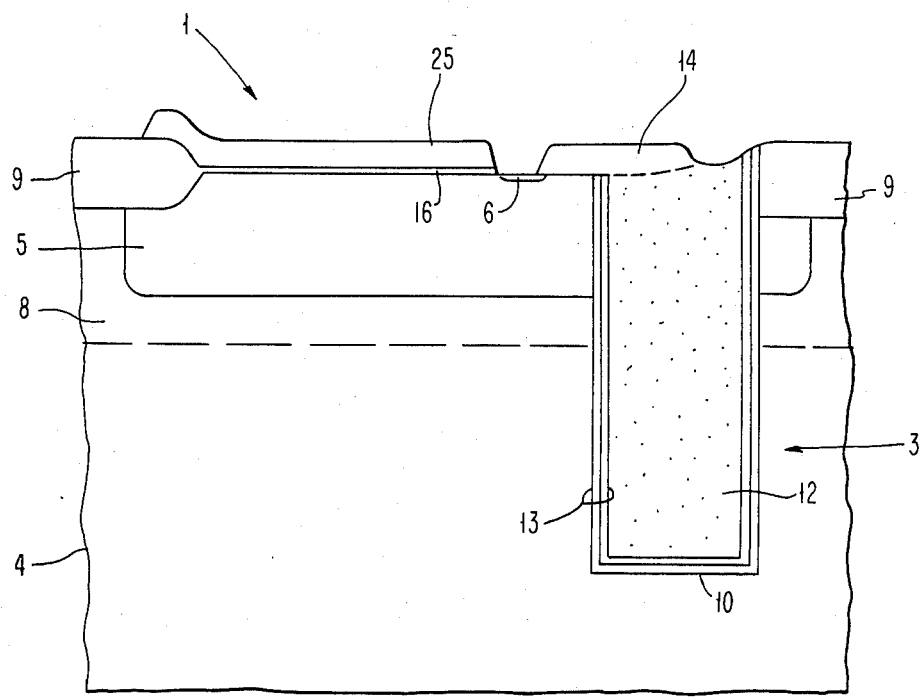
FIG. 4 is a cross-sectional view of the structure of FIG. 3 at a later stage in its fabrication process.

FIG. 4 shows a cross-sectional view of the device of FIG. 1 at another intermediate stage in its fabrication after a thin, heavily doped p$^+$-conductivity type layer has been deposited and patterned to form bridge region 14 over insulation layer 13 between source region 6 of access transistor 2 and plug 12.

The structure of FIG. 4 is obtained by first adding a nitride layer 25 on top of the oxide and nitride layers which were formed during the formation of layer 13 on the inside of trench 10. Layers 16, 25 are then covered with a layer of photoresist. The latter is patterned and developed in a well-known manner exposing a portion of nitride layer 25. Then, using RIE, portions of nitride layer 25 and oxide layer 16 are removed exposing a portion of substrate 4 in which a portion of source region 6 is to be formed, the top of plug 12 and ROX regions 9. A thin layer of heavily doped p$^+$-conductivity type polycrystalline silicon is deposited from boron doped silane and patterned using well-known photolithographic and etching techniques to form bridge region 14 which interconnects source region 6 and the top of plug 12 which are spaced from each other by a portion of insulation layer 13. The patterning of the polycrystalline layer leaves a surface portion of substrate 4 exposed. Using well-known ion implantation techniques, a very shallow boron implant is made in the exposed portion of substrate 4 forming a portion of source region 6. The remaining portion of source region 6 is formed by out-diffusion of dopant from bridge region 14 during an annealing step which activates the shallow boron implant. It should be noted that the out-diffused portion of source region 6 is butted against insulator layer 13 resulting in cell area reduction.

At this point, using nitride layer 25 as a mask, an oxide layer is thermally grown and forms insulation over the exposed portion of substrate 4, bridge region 14 and any remaining exposed surface of plug 12. At the same time, ROX region 9 undergoes further growth thereby increasing its thickness from that provided in the initial ROX growth step. Because it was recognized that a step would be taken later on in the process which was tantamount to another ROX growth step, the initial ROX growth step was limited to produce rather thin ROX regions. As a result, RIE etching of trench 10 through ROX region 9 was simplified and ROX bird's beak formation was reduced.

After the growth of the last mentioned oxide layer, nitride layer 25 is removed by wet etching. A layer of heavily doped n$^+$-conductivity type polycrystalline silicon is deposited and patterned using conventional photolithographic and etching techniques to form gate electrode 15 and elements 18,19 which connect to the gates electrodes of adjacnet cells as shown in FIG. 2. At this point, substrate 4 is subjected to a boron ion implantation step which forms self-aligned drain region 7 in substrate 4 using a ROX region 9 and gate electrode 15 as an implantation mask. The dopant concentrations in both drain region 7 and source region 6 are $1 \times 10^{20}$ atoms cm$^{-3}$ and $1 \times 10^{19}$ atoms cm$^{-3}$, respectively. After implanting drain region 7, substrate 4 is subjected to a thermal oxide growth step to insulate gate electrode 15, element 18 and the surface of substrate 4 in which drain region 7 was implanted. Metallization is then applied after a deposited photoresist layer is exposed, patterned and developed. The structure resulting from the foregoing process steps is shown in FIG. 1.

At this point, it should be appreciated that, while only a single DRAM cell 1 has been shown in FIG. 1, a plurality of DRAM cells 1 are normally formed in n-well 5 and fabricated simultaneously therein in the same manner as described hereinabove. It should also be appreciated that, while an n-well 5 has been shown in FIG. 1, a p-well may just as easily be used. Then, of course, the conductivity types of source and drain regions 6,7, respectively, and substrate portions 8,11 should be changed to n-conductivity type.

The DRAM cell described above is compatible with expitaxial CMOS technology. As previously indicated, higher packing density is achievable because of the elimination of punch-through current between trenches and low soft error rates are obtained. Also, stored charge is disturbed much less in the present cell. Finally, the resulting structure has a relatively flat surface topology.

In operation, DRAM cell 1 has potentials of either zero or five volts applied to drain 7 of access transistor 2 from pulsed source 24. At the same time either zero or five volts is being applied to drain 7, zero volts is applied to gate electrode 15 rendering access transistor 2 conductive. Thus, with substrate 4 grounded, a binary "1" may be written into storage capacitor 3 by applying five volts to drain 7 and zero volts to gate electrode 15 charging electrode or plug 12 to a potential of five volts. A binary "0" may be written into storage capacitor 3 by applying zero volts to both drain 7 and gate electrode 15 charging electrode 12 to a potential equal to the absolute value of the threshold. Both binary states may be read by applying zero volts to gate electrode 15.

As previously indicated, the conductivity types shown in DRAM cell 1 may be changed to opposite conductivity type without departing from the spirit of the present invention. Thus, with substrate 4 grounded, a binary "1" may be written into storage capacitor 3 by applying five volts to both drain 7 and gate electrode 15 charging electrode 12 to a potential of five volts minus the threshold voltage of access transistor 2. A binary "0" may be written into storage capacitor 3 by applying zero volts to drain 7 and five volts to gate electrode 15 charging electrode 12 to approximatey zero volts. Both binary states may be read by applying five volts to gate electrode 15.

Having thus described our invention, what we claim as new, and desire to secure by Letters Patent is:

1. A dynamic random access memory cell array comprising:
   a substrate of a first conductivity type the upper portion of which is less conductive than its highly conductive lower portion,
   a region disposed in said upper portion of said substrate, having a conductivity type opposite to that of said substrate,
   at least one access device disposed in said region, and
   at least one storage means extending from the surface of said region through said region and said upper portion into said highly conductive lower portion of said substrate said storage means being electrically isolated from said region and said upper and lower portions.

2. A dynamic random access memory cell according to claim 1 further including means for interconnecting said at least one access device and said at least one storage means.

3. A dynamic random access memory cell according to claim 1 further including means connected to said region for applying a bias to said region.

4. A dynamic random access memory cell according to claim 1 further including means connected to said at least one access device for transferring binary information to and from said at least one storage means.

5. A dynamic random access memory cell according to claim 1 wherein said substrate is made of semiconductor material at least a portion of which is heavily doped.

6. A dynamic random access memory cell according to claim 1 wherein said region is a region of semiconductor material.

7. A dynamic random access memory cell according to claim 1 wherein said at least one access device is a field effect transistor.

8. A dynamic random access memory cell according to claim 1 wherein said at least one storage means is an electrode disposed in insulated spaced relationship with said substrate.

9. A dynamic random access memory cell according to claim 1 wherein said substrate includes a heavily doped lower portion and a lightly doped upper portion disposed over said heavily doped lower portion.

10. A dynamic random access memory cell according to claim 2 further including means connected to said region for applying a bias to said region.

11. A dynamic random access memory cell according to claim 2 further including means connected to said at least one access device for transferring binary information to and from said at least one storage means.

12. A dynamic random access memory cell according to claim 3 wherein said means for applying a bias is a voltage source.

13. A dynamic random access memory cell according to claim 4 wherein said means for transferring binary information includes a pair of pulsed voltage sources connected to said at least one access device.

14. A dynamic random access memory cell according to claim 5 wherein said semiconductor material is silicon of n-conductivity or p-conductivity type.

15. A dynamic random access memory cell according to claim 6 wherein said semiconductor material is silicon of p-conductivity or n-conductivity type.

16. A dynamic random access memory cell according to claim 8 wherein said electrode is comprised of heavily doped polycrystalline silicon.

17. A dynamic random access memory cell according to claim 9 wherein said region is disposed in said lightly doped upper portion of said substrate.

18. A dynamic random access memory cell according to claim 10 further including means connected to said at least one access device for transferring binary information to and from said at least one storage means.

19. A dynamic random access memory cell comprising
   a counterelectrode of a first conductivity type the upper portion of which is less conductive than its highly conductive lower portion,
   a region disposed in said upper portion of said counterelectrode having a conductivity type opposite to that of said counterelectrode,
   at least one access device disposed in said region,
   at least one trench extending from the surface of said region through said region and said upper portion into said highly conductive lower portion of said counterelectrode, and,
   at least one storage electrode in said at least one trench, said storage electrode being disposed in insulated spaced relationship with said counterelectrode.

20. A dynamic random access memory cell according to claim 19 further including means for interconnecting said at least one storage electrode and said at least one access device.

21. A dyanmic random access memory cell according to claim 20 further including means connected to said region for applying a bias to said region.

22. A dynamic random access memory cell according to claim 21 further including means connected to said at least one access device for transferring binary information to and from said at least one storage electrode.

23. A dynamic random access memory cell according to claim 22 wherein said counterelectrode is a semiconductor substrate at least a portion of which is heavily doped.

24. A dynamic random access memory cell according to claim 23 wherein said region is a region of semiconductor material.

25. A dynamic random access memory cell according to claim 24 wherein said at least one access device is a field effect transistor.

26. A dynamic random access memory cell according to claim 25 wherein said at least one storage electrode is made of heavily doped, polycrystalline semiconductor material.

27. A dynamic random access memory cell according to claim 26 wherein said means for interconnecting is a region of polycrystalline semiconductor material.

28. A dynamic random access memory cell according to claim 27 wherein said semiconductor material is silicon.

29. A dynamic random access memory cell comprising
a semiconductor substrate having a lightly doped portion of one conductivity type overlying a heavily doped portion of the same conductivity type,
a region of second conductivity type disposed in said lightly doped portion,
at least one access transistor disposed in said region,
at least one trench extending from the surface of said region through said region and said lightly doped portion into said heavily doped portion, and,
at least one storage electrode disposed in insulated spaced relationship with and in said at least one trench.

30. A dynamic random access memory cell according to claim 29 further including means for interconnecting said at least one storage electrode and said at least one access transistor.

31. A dynamic random access memory cell according to claim 30 further including means connected to said region for applying a bias to said region.

32. A dynamic random access memory cell according to claim 31 further including means connected to said at least one access transistor for transferring binary information to and from said at least one storage electrode.

33. A dynamic random access memory cell according to claim 32 wherein said at least one access transistor is a field effect transistor.

34. A dynamic random access memory cell according to claim 33 wherein said at least one storage electrode is made of heavily doped, polycrystalline semiconductor material.

35. A dynamic random access memory cell according to claim 34 wherein said means for interconnecting is a region of polycrystalline semiconductor material.

36. A dynamic random access memory cell according to claim 35 wherein said semiconductor material is silicon.

37. A dynamic random access memory cell array formed in a semiconductor substrate having a first conductivity type, said substrate having therein a region of semiconductor material of the opposite conductivity type disposed in a lightly doped portion of said substrate,
an access transistor located in said region,
a trench storage capacitor extending from the surface of said region through said region and said lightly doped portion into the remaining portion of said substrate, said capacitor having a dielectric layer and a first electrode disposed in said trench, said substrate and said region forming a second electrode of said capacitor, and
means located over said region and electrically connecting said access transistor and said first electrode.

38. The array of claim 37, where said first electrode is a storage electrode and said access transistor is a FET.

39. The array of claim 38, where said semiconductor is silicon and said first electrode is heavily doped polysilicon.

40. The array of claim 39, where said FET has an electrical source or drain region formed in said well said source or drain region being in contact with said dielectric layer.

41. A dynamic random access memory cell array formed in a semiconductor substrate of a first conductivity type having a region formed in a portion thereof said region having a conductivity type opposite to that of said substrate,
an access transistor formed in said region,
a storage capacitor having a vertically disposed storage electrode and a vertically disposed dielectric layer, said storage electrode and said dielectric layer extending from the surface of said region through said region and into said substrate, and
an electrical interconnection overlying said region and electrically connecting said access transistor and said storage electrode.

42. The array of claim 41, where said substrate includes a highly conductive portion remote from said region said highly conductive portion being in contact with said dielectric layer and forming a counterelectrode of said storage capacitor.

43. The array of claim 42, where said highly conductive region of said substrate is separated from said region by a more lightly conducting portion of said substrate.

44. A dynamic random access memory cell array formed in a substrate of a first conductivity type having therein a region of opposite conductivity type disposed in a lower conductivity upper portion of said substrate,
an access transistor extending laterally in said region,
a first electrode extending vertically from the surface of said region through said region and into said substrate,
a dielectric layer in contact with said first electrode and extending vertically through said region and into said substrate,
a second electrode comprised of a portion of said region and a portion of said substrate and being insulated from said first electrode by said dielectric layer, and an electrical interconnection located over said region and electrically interconnecting said access transistor and said first electrode.

45. The array of claim 44, wherein said substrate includes a highly doped portion in contact with said dielectric layer, said highly doped portion being separated from said electrical interconnection by a lightly doped portion of said substrate and by said opposite conductivity type region.

46. A dynamic random access memory cell array formed in a single crystal semiconductor substrate having a first conductivity type, said substrate having therein a semiconductor region of an opposite conductivity type disposed in a low conductivity upper portion of said substrate, said substrate having a laterally extending lower portion thereof which is highly doped to render it conductive, a trench extending vertically through said region and said upper portion into said highly doped portion of said single crystal substrate, said trench defining the geometry of a capacitor for storing charge thereon, an access transistor formed in said region, a dielectric layer formed on the inner surface of said trench, said dielectric layer being in contact with said highly doped portion of said substrate, a first electrode formed in said trench in contact with said dielectric layer, said first electrode extending into said highly doped portion of said substrate and being separated therefrom by said dielectric layer, a second electrode comprised of said region and said highly doped portion of said single crystal substrate which contacts said dielectric layer, and a conductive layer electrically connecting said access transistor and said capacitor.

* * * * *